(12) United States Patent  
Ishii et al.

(10) Patent No.: US 7,723,617 B2
(45) Date of Patent: May 25, 2010

(54) WIRED CIRCUIT BOARD AND PRODUCTION METHOD THEREOF

(75) Inventors: Jun Ishii, Osaka (JP); Yasunari Ooyabu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 56 days.

(21) Appl. No.: 11/892,052

(22) Filed: Aug. 20, 2007

(65) Prior Publication Data

US 2008/0053686 A1 Mar. 6, 2008

Related U.S. Application Data

(60) Provisional application No. 60/847,112, filed on Sep. 26, 2006.

(30) Foreign Application Priority Data

Aug. 30, 2006 (JP) ............... 2006-234115

(51) Int. Cl.
*H05K 1/00* (2006.01)
(52) U.S. Cl. ................... 174/254; 360/245.9
(58) Field of Classification Search ............. 174/254; 360/245.9
See application file for complete search history.

(56) References Cited

U.S. PATENT DOCUMENTS

| | | | |
|---|---|---|---|
| 5,612,512 A | 3/1997 | Wakamatsu et al. | |
| 5,666,717 A | 9/1997 | Matsumoto et al. | |
| 5,709,957 A | 1/1998 | Chiang et al. | |
| 5,796,552 A | 8/1998 | Akin et al. | |
| 5,857,257 A * | 1/1999 | Inaba .................... | 29/603.04 |
| 5,995,329 A | 11/1999 | Shiraishi et al. | |
| 6,100,582 A | 8/2000 | Omote et al. | |
| 6,147,876 A | 11/2000 | Yamaguchi et al. | |
| 6,162,996 A | 12/2000 | Schmidt et al. | |
| 6,242,103 B1 | 6/2001 | Farnworth et al. | |
| 6,399,899 B1 | 6/2002 | Ohkawa et al. | |
| 6,480,359 B1 | 11/2002 | Dunn et al. | |
| 6,602,584 B2 | 8/2003 | Jo et al. | |
| 6,735,052 B2 * | 5/2004 | Dunn et al. ............... | 360/245.9 |
| 7,013,561 B2 | 3/2006 | Nakatani et al. | |
| 7,067,912 B2 | 6/2006 | Takeuchi et al. | |
| 7,182,606 B2 | 2/2007 | Ishii et al. | |
| 7,319,573 B2 * | 1/2008 | Nishiyama ............... | 360/245.9 |
| 2002/0074662 A1 | 6/2002 | Hong et al. | |
| 2002/0100609 A1 | 8/2002 | Ookawa et al. | |
| 2004/0173375 A1 | 9/2004 | Lee et al. | |
| 2004/0245015 A1 | 12/2004 | Yoshimi et al. | |
| 2004/0245619 A1 | 12/2004 | Takeuchi et al. | |
| 2004/0246626 A1 | 12/2004 | Wakaki et al. | |
| 2004/0252413 A1 | 12/2004 | Nishiyama | |

(Continued)

FOREIGN PATENT DOCUMENTS

CN 1112877 12/1995

(Continued)

*Primary Examiner*—Ishwarbhai B Patel
(74) *Attorney, Agent, or Firm*—Jean C. Edwards, Esq.; Akerman Senterfitt

(57) ABSTRACT

A wired circuit board has a metal supporting board, a metal foil formed on the metal supporting board to have a thickness of less than 2.0 μm, a first insulating layer formed on the metal supporting board to cover the metal foil, and a conductive pattern formed on the first insulating layer.

8 Claims, 7 Drawing Sheets

U.S. PATENT DOCUMENTS

| | | |
|---|---|---|
| 2005/0061542 A1 | 3/2005 | Aonuma et al. |
| 2005/0122627 A1 | 6/2005 | Kanagawa et al. |
| 2005/0186332 A1 | 8/2005 | Funada et al. |
| 2006/0199402 A1 | 9/2006 | Ishii et al. |

FOREIGN PATENT DOCUMENTS

| | | |
|---|---|---|
| CN | 1339822 | 3/2002 |
| CN | 1415474 | 5/2003 |
| EP | 1592290 | 11/2005 |
| JP | 59-219492 | 12/1984 |
| JP | 1-150390 | 6/1989 |
| JP | 3-274799 | 12/1991 |
| JP | 05-304345 | 11/1993 |
| JP | 07-202365 | 8/1995 |
| JP | 8-307020 | 11/1996 |
| JP | 9-282624 | 10/1997 |
| JP | 10-163590 | 6/1998 |
| JP | 2000-513861 | 10/2000 |
| JP | 2001-085842 | 3/2001 |
| JP | 2001-256627 | 9/2001 |
| JP | 2002-057437 | 2/2002 |
| JP | 2004-363205 | 12/2004 |
| JP | 2004-363331 | 12/2004 |
| JP | 2005-011387 | 1/2005 |
| JP | 2005-158973 | 6/2005 |
| JP | 2005-235318 A | 9/2005 |
| JP | 2006-173399 | 6/2006 |
| JP | 2006-245220 | 9/2006 |

* cited by examiner (a)

(b)

(c)

(d)

(e)

(f)

(g)

(h)

(i)

1

WIRED CIRCUIT BOARD AND PRODUCTION METHOD THEREOF

CROSS-REFERENCE TO RELATED APPLICATION

This patent application claims the benefit of U.S. Provisional Application No. 60/847,112, filed on Sep. 26, 2006, and claims priority from Japanese Patent Application No. 2006-234115, filed on Aug. 30, 2006, the contents of which are herein incorporated by reference in their entirety.

BACKGROUND OF THE INVENTION

1. Field of the Invention

The present invention relates to a wired circuit board and a method for producing the same and, more particularly, to a wired circuit board such as a suspension board with circuit and a method for producing the same.

2. Description of the Related Art

There has been conventionally known a suspension board with circuit including a metal supporting board made of stainless steel, an insulating layer made of a polyimide resin formed thereon, and a conductive pattern made of copper formed thereon.

In recent years, in terms of higher data density, an increase in the frequency of a signal has been required in such a suspension board with circuit. However, when the frequency of the signal is increased, a transmission loss increases undesirably in the conductive pattern.

To prevent this, it is proposed that, e.g., a lower conductor having a thickness of 5 μm formed of copper or a copper alloy containing copper as a main component is provided on a suspension, an insulating layer having a thickness of 5 to 10 μm is provided on the lower conductor, and conductors composed of a record-side line and a reproduction-side line are provided on the insulating layer for a reduction in the transmission loss in the conductors (see, e.g., Japanese Unexamined Patent Publication No. 2005-11387).

In the proposal mentioned above, a simulation is also performed in which transmission loss in the conductors can be reduced effectively by adjusting the thickness of the lower conductor to 2 to 12 μm.

SUMMARY OF THE INVENTION

However, when the lower conductor is formed to have a thickness suggested in the proposal and simulation mentioned above and then covered with an insulating base layer, a large level difference corresponding to the thickness of the lower conductor is produced in the insulating base layer covering the end portion of the lower conductor.

Consequently, when a conductive pattern is formed on such an insulating base layer, the displacement of the conductive pattern may occur due to the level difference to degrade the accuracy thereof.

Furthermore, in the case where an insulating cover layer is formed on the insulating base layer to cover the conductive pattern, an air pocket is more likely to be formed in the insulating cover layer due to unevenness resulting from the level difference in the insulating base layer and from the displacement of the conductive pattern. As a result, stripping may occur due to thermal expansion or the like to degrade the reliability of the wired circuit board.

It is therefore an object of the present invention to provide a wired circuit board which allows a reduction in transmission loss in the conductive pattern and also accurate formation of the conductive pattern to provide excellent long-term reliability and a method for producing the same.

A wired circuit board according to the present invention comprises a metal supporting board, a metal foil formed on the metal supporting board to have a thickness of less than 2.0 μm, a first insulating layer formed on the metal supporting board to cover the metal foil, and a conductive pattern formed on the first insulating layer.

In the wired circuit board, the metal foil is formed under the conductive pattern. As a result, it is possible to reduce the transmission loss with a simple layer structure.

Since the thickness of the metal foil is less than 2.0 μm, the level difference formed between the respective portions of the first insulating layer where the metal foil is formed and where the metal foil is not formed can be reduced. As a result, it is possible to accurately form the conductive pattern on the first insulating layer.

In the case where an insulating cover layer is formed on the first insulating layer to cover the conductive pattern, the insulating cover layer can be formed on the surface of the first insulating layer with reduced unevenness because the level difference in the first insulating layer is small and the conductive pattern is formed accurately. As a result, it is possible to suppress the formation of an air pocket in the insulating cover layer to ensure excellent long-term reliability.

It is preferable that the wired circuit board according to the present invention further comprises a first metal thin film formed to be interposed between the metal foil and the metal supporting board.

In the wired circuit board, the first metal thin film is formed between the metal supporting board and the metal foil. As a result, it is possible to reduce the transmission loss with a simple layer structure and provide sufficient adhesion between the metal supporting board and the metal foil to ensure excellent long-term reliability.

It is preferable that the wired circuit board according to the present invention further comprises a second insulating layer formed to be interposed between the first metal thin film and the metal supporting board.

In the wired circuit board, the second insulating layer is formed between the first metal thin film and the metal supporting board. As a result, it is possible to reduce the transmission loss with a simple layer structure and provide sufficient adhesion between the first metal thin film and the metal supporting board to ensure excellent long-term reliability.

It is preferable that the wired circuit board according to the present invention further comprises a second insulating layer formed to be interposed between the metal foil and the metal supporting board.

In the wired circuit board, the second insulating layer is formed between the metal foil and the metal supporting board. As a result, it is possible to reduce the transmission loss with a simple layer structure and provide sufficient adhesion between the metal foil and the metal supporting board to ensure excellent long-term reliability.

It is preferable that the wired circuit board according to the present invention further comprises a second metal thin film formed to be interposed between the metal foil and the first insulating layer.

When the first insulating layer is formed directly on the surface of the metal foil, there is a case where ion migration phenomenon occurs in which the metal of the metal foil migrates to the first insulating layer.

However, in the wired circuit board, the second metal thin film interposed between the metal foil and the first insulating layer serves as a barrier layer to allow reliable prevention of the occurrence of the ion migration phenomenon.

In the wired circuit board according to the present invention, it is preferable that the conductive pattern comprises a plurality of wires arranged in mutually spaced-apart relation and the metal foil comprises a plurality of discrete portions arranged in mutually spaced-apart relation such that at least a portion of the respective discrete portions opposes to the respective wires in a thickness direction.

In the wired circuit board, the metal foil includes the plurality of discrete portions arranged in mutually spaced-apart relation. As a result, the metal foil can be formed to correspond to the plurality of wires, while retaining flexibility.

When the metal foil includes the discrete portions, a larger number of end portions are formed in the metal foil to correspond to the discrete portions. Accordingly, a larger number of level differences are formed in the first insulating layer. However, in the wired circuit board, the thickness of the metal foil is less than 2.0 μm and the level differences resulting from the thickness of the metal foil can be reduced. As a result, even when a large number of level differences are formed in the first insulating layer, the conductive pattern can be formed accurately.

In the wired circuit board according to the present invention, it is preferable that the metal foil is formed by sputtering.

When the thickness of the metal foil is not less than 2.0 μm, it is normally necessary to form the metal foil in the two steps of forming a seed film by sputtering and then forming a plating layer on the seed film by electrolytic plating.

However, in the wired circuit board, the thickness of the metal foil is less than 2.0 μm. As a result, the metal foil can be formed only by sputtering. This allows easy formation of the metal foil in one step to achieve a reduction in production cost.

A method for producing a wired circuit board according to the present invention comprises the steps of preparing a metal supporting board, forming a metal foil on the metal supporting board by sputtering, forming a first insulating layer on the metal supporting board to cover the metal foil, and forming a conductive pattern on the first insulating layer.

In the method for producing a wired circuit board, the metal foil is formed. As a result, it is possible to reduce the transmission loss in the wired circuit board obtained.

In addition, in the method for producing a wired circuit board, the metal foil is formed only by sputtering. As a result, it is possible to form the metal foil with a reduced thickness and reduce a level difference resulting from the thickness of the metal foil in the formation of the first insulating layer. This allows accurate formation of the conductive pattern on the first insulating layer.

In the case where an insulating cover layer is formed on the first insulating layer to cover the conductive pattern, the insulating cover layer can be formed on the surface of the first insulating layer with reduced unevenness because the level difference in the first insulating layer is small and the conductive pattern is formed accurately. As a result, it is possible to suppress the formation of an air pocket in the insulating cover layer and produce a wired circuit board capable of providing excellent long-term reliability.

Because the metal foil is formed only by sputtering, the metal foil can be formed in one step. This allows easy formation of the metal foil and easy production of a wired circuit board.

DETAILED DESCRIPTION OF THE INVENTION

Figure 1:
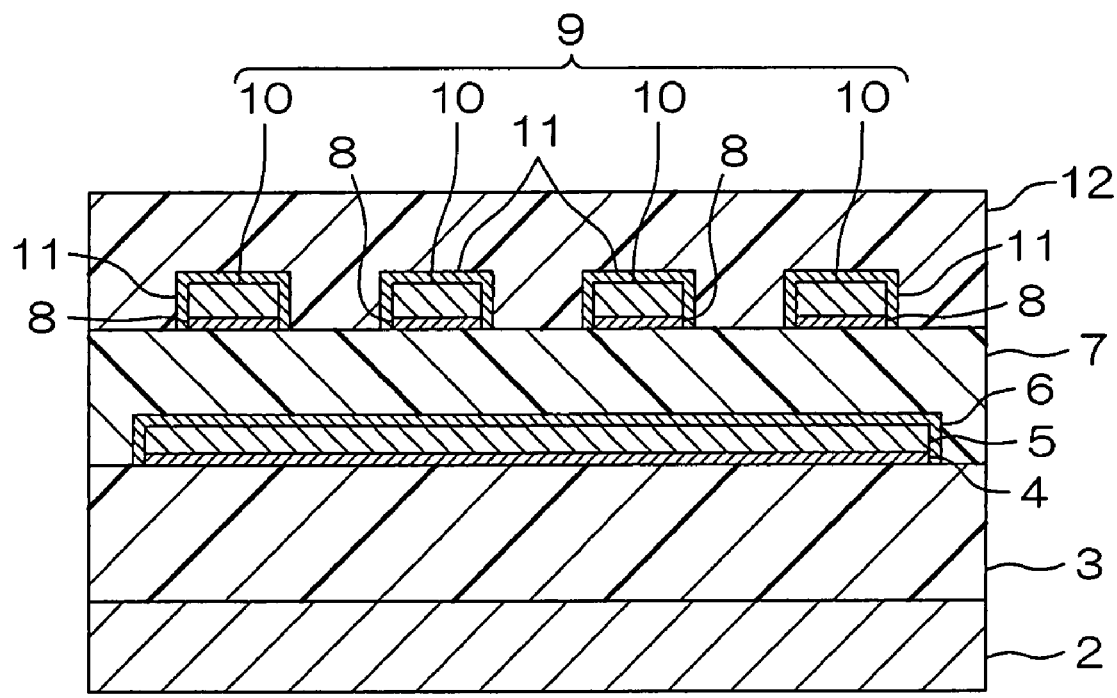
FIG. 1 is a cross-sectional view showing a principal portion of a wired circuit board according to an embodiment of the present invention.

FIG. 1 is a cross-sectional view showing a principal portion of a wired circuit board according to an embodiment of the present invention.

In FIG. 1, a wired circuit board 1 is a suspension board with circuit mounted on a hard disk drive. The wired circuit board 1 includes a metal supporting board 2 extending in a longitudinal direction, a second insulating base layer 3 as a second insulating layer formed on the metal supporting board 2, a first metal thin film 4 formed on the second insulating base layer 3, a metal foil 5 formed on the first metal thin film 4, a second metal thin film 6 formed on the second insulating base layer 3 to cover the metal foil 5, and a first insulating base layer 7 as a first insulating layer formed on the second insulating base layer 3 to cover the second metal thin film 6. In addition, the wired circuit board 1 includes a third metal thin film 8 formed on the first insulating base layer 7, a conductive pattern 9 formed on the third metal thin film 8, a fourth metal thin film 11 formed on the first insulating base layer 7 to cover the conductive pattern 9, and an insulating cover layer 12 formed on the first insulating base layer 7 to cover the fourth metal thin film 11.

The metal supporting board 2 is composed of a metal foil in the shape of a flat plate or of a metal thin plate. Examples of a metal used to form the metal supporting board 2 include stainless steel and a 42-alloy. Preferably, stainless steel is used. The thickness of the metal supporting board 2 is in the range of, e.g., 15 to 30 μm, or preferably 20 to 25 μm.

The second insulating base layer 3 is formed on a surface of the metal supporting board 2. More specifically, the second insulating base layer 3 is formed on the entire surface of the metal supporting board 2 in a widthwise direction (orthogonal to the longitudinal direction).

Examples of an insulating material used to form the second insulating base layer 3 include synthetic resins such as polyimide, polyether nitrile, polyether sulfone, polyethylene terephthalate, polyethylene naphthalate, and polyvinyl chloride, each of which is typically used as an insulating material for a wired circuit board. Among them, a photosensitive synthetic resin is preferably used, or more preferably, photosensitive polyimide is used. The thickness of the second insulating base layer 3 is in the range of, e.g., 1 to 10 μm, or preferably 1 to 5 μm.

The first metal thin film 4 is formed in a pattern on the surface of the second insulating base layer 3 to correspond to a portion where the metal foil 5 is formed in a thickness direction. More specifically, the first metal thin film 4 is formed between the two widthwise outermost wires 10 of a plurality of (four) wires 10 arranged in widthwise mutually spaced-apart relation as is described later, to oppose to these wires 10 in the thickness direction and have a width smaller than that of the second insulating base layer 3. The first metal thin film 4 is formed to be interposed between the metal foil 5 and the second insulating base layer 3.

Examples of a metal used to form the first metal thin film 4 include copper, chromium, gold, silver, platinum, nickel, titanium, silicon, manganese, zirconium, an alloy thereof, and an oxide thereof. Preferably, copper, chromium, nickel, or an alloy thereof is used. The first metal thin film 4 can also be formed of a plurality of layers. The thickness of the first metal thin film 4 is in the range of, e.g., 0.01 to 1 μm, or preferably 0.01 to 0.1 μm.

The metal foil 5 is formed in a pattern on the surface of the first metal thin film 4 to correspond to at least a portion where the conductive pattern 9 is formed in the thickness direction. More specifically, the metal foil 5 is formed on the entire surface of the first metal thin film 4.

Examples of a metal used to form the metal foil 5 include copper, nickel, gold, a solder, and an alloy thereof. Preferably, copper is used. The thickness of the metal foil 5 is less than 2.0 μm. More specifically, the thickness of the metal foil 5 is not less than 0.1 μm and is less than 2.0 μm, preferably in the range of 0.2 to 1.5 μm, or more preferably 0.2 to 0.5 μm. When the thickness of the metal foil 5 is not less than 2.0 μm, a level difference 15 (see FIG. 9) in the first insulating base layer 7, which is described later, increases in size so that it is difficult to form the conductive pattern 9 with high accuracy.

The second metal thin film 6 is formed on the surface of the metal foil 5 to cover the metal foil 5. More specifically, the second metal thin film 6 is formed to cover the upper surface and side surfaces of the metal foil 5 and the side surfaces of the first metal thin film 4. The second metal thin film 6 is formed to be interposed between the first insulating base layer 7 and both of the metal foil 5 and the first metal thin film 4.

Examples of a metal used to form the second metal thin film 6 include nickel, chromium, and an alloy of nickel and chromium (nichrome). Preferably, nickel is used. The thickness of the second metal thin film 6 is in the range of, e.g., 0.01 to 1 μm, or preferably 0.01 to 0.1 μm.

The first insulating base layer 7 is formed on the second insulating base layer 3 to cover the second metal thin film 6. To form the first insulating baser layer 7, any of the same insulating materials is used as that used to form the second insulating base layer 3 mentioned above. Preferably, a photosensitive synthetic resin is used, or more preferably, photosensitive polyimide is used. The thickness of the first insulating base layer 7 is in the range of, e.g., 1 to 10 μm, or preferably 5 to 10 μm.

The third metal thin film 8 is formed in a pattern on the surface of the first insulating base layer 7 to oppose to a portion where the conductive pattern 9 is formed. The third metal thin film 8 is formed to be interposed between the conductive pattern 9 and the first insulating base layer 7.

To form the third metal thin film 8, any of the same metals is used as that used to form the first metal thin film 4 mentioned above. Preferably, copper, chromium, or nickel is used. The third metal thin film 8 can also be formed of a plurality of layers. The thickness of the third metal thin film 8 is in the range of, e.g., 0.01 to 1 μm, or preferably 0.01 to 0.1 μm.

The conductive pattern 9 is formed as a wired circuit pattern composed of the plurality of (e.g., four) wires 10 provided on the surface of the third metal thin film 8 and above the first insulating base layer 7 to be arranged in widthwise mutually spaced-apart and longitudinally parallel relation, and of terminal portions provided on both longitudinal end portions of the respective wires 10, though not shown.

Examples of a conductive material used to form the conductive pattern 9 include metals such as copper, nickel, gold, a solder, or an alloy thereof, each of which is typically used as a conductive material for a wired circuit board. Among them, copper is preferably used. The thickness of the conductive pattern 9 is in the range of, e.g., 5 to 20 μm, or preferably 7 to 15 μm. The width of each of the wires 10 is in the range of, e.g., 15 to 100 μm, or preferably 20 to 50 μm. The spacing between the individual wires 10 is in the range of, e.g., 15 to 100 μm, or preferably 20 to 50 μm.

The fourth metal thin film 11 is formed on the surface of the conductive pattern 9 to cover the conductive pattern 9. More specifically, the fourth metal thin film 11 is formed to cover the upper surface (except for the upper surfaces of the terminal portions) and side surfaces of the wires of the conductive pattern 9, and the side surfaces of the third metal thin film 8. The fourth metal thin film 11 is formed to be interposed between the insulating cover layer 12 and both of the conductive pattern 9 and the third metal thin film 8.

To form the fourth metal thin film 11, any of the same metals is used as that used to form the second metal thin film 6, or preferably, nickel is used. The thickness of the fourth metal thin film 11 is in the range of, e.g., 0.01 to 1 μm, or preferably 0.01 to 0.1 μm.

The insulating cover layer 12 is formed on the first insulating base layer 7 to cover the fourth metal thin film 11. More specifically, the insulating cover layer 12 is formed on the entire surface in the widthwise direction of the first insulating base layer 7.

To form the insulating cover layer 12, any of the same insulating materials is used as that used to form the second insulating base layer 3 mentioned above. Preferably, a photosensitive synthetic resin is used, or more preferably, photosensitive polyimide is used. The thickness of the insulating cover layer 12 is in the range of, e.g., 2 to 10 μm, or preferably 3 to 6 μm. The insulating cover layer 12 has openings formed to expose the terminal portions of the conductive pattern 9, though not shown.

Figure 2:
FIG. 2 is a production process view showing a method for producing the wired circuit board shown in FIG. 1, (a) showing the step of preparing a metal supporting board, (b) showing the step of forming a second insulating base layer on the metal supporting board, (c) showing the step of forming a first metal thin film on the entire surface of the second insulating base layer, (d) showing the step of forming a metal foil on the entire surface of the first metal thin film, and (e) showing the step of forming an etching resist on the surface of the first metal thin film in the same pattern as the pattern of the metal foil.
Figure 2:
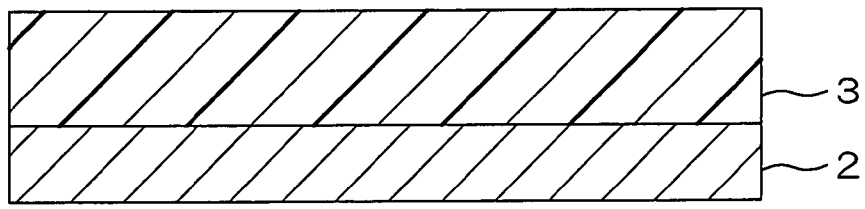
Figure 2:
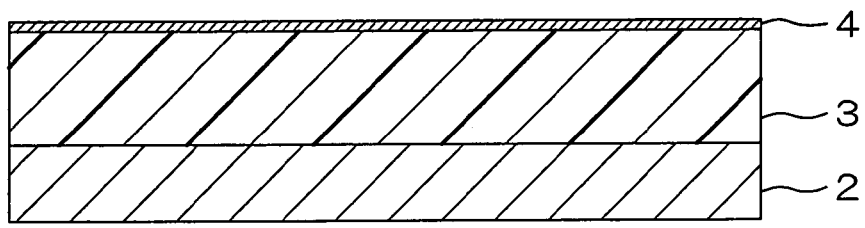
Figure 2:
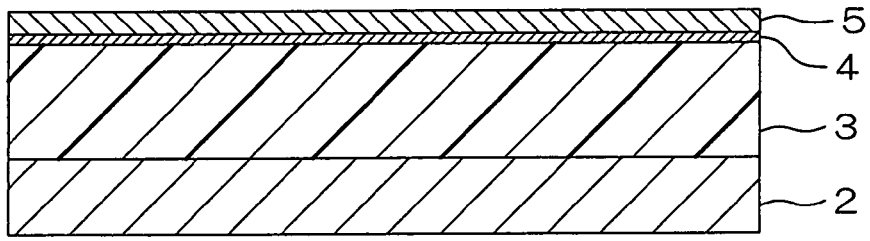
Figure 2:
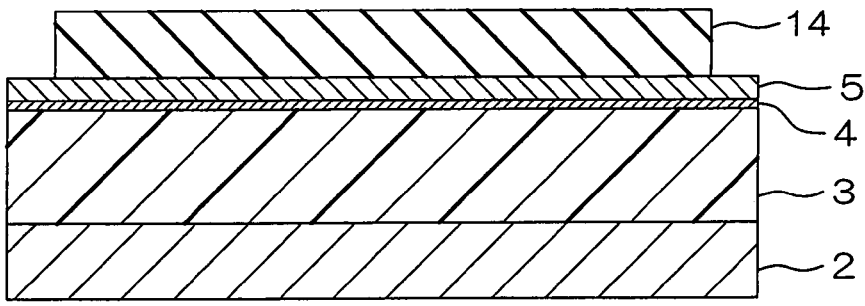
Figure 3:
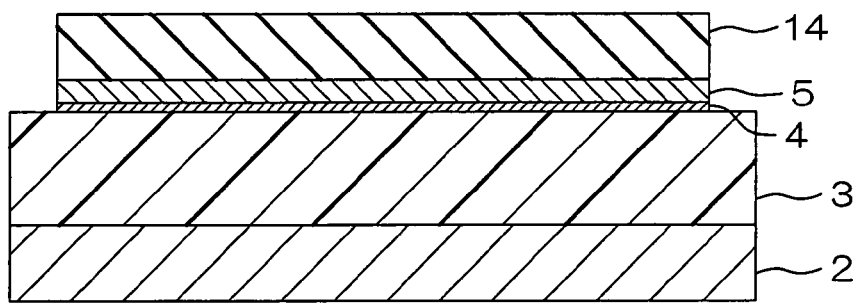
FIG. 3 is a production process view showing the method for producing the wired circuit board shown in FIG. 1, subsequently to FIG. 2, (f) showing the step of removing the first metal thin film and the metal foil each exposed from the etching resist, (g) showing the step of removing the etching resist, (h) showing the step of forming a second metal thin film to cover the metal foil, and (i) showing the step of forming a first insulating base layer on the second insulating base layer to cover the second metal thin film.
Figure 3:
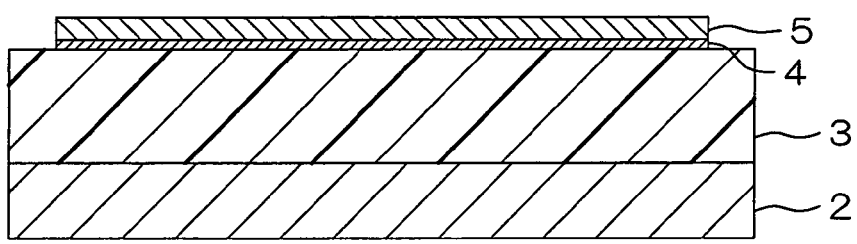
Figure 3:
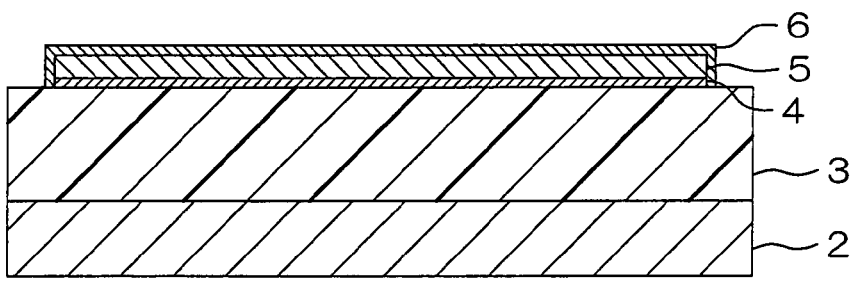
Figure 3:
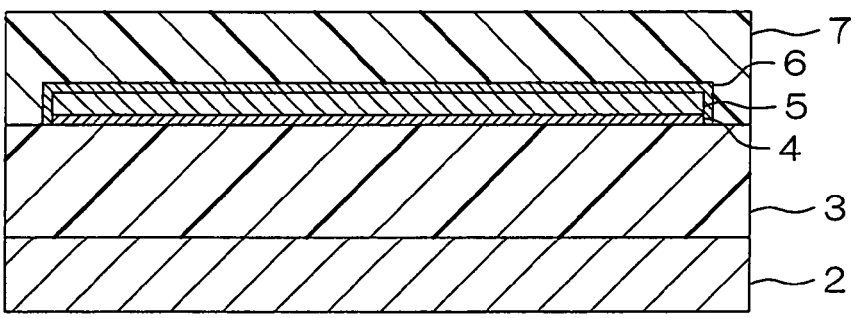
Figure 4:
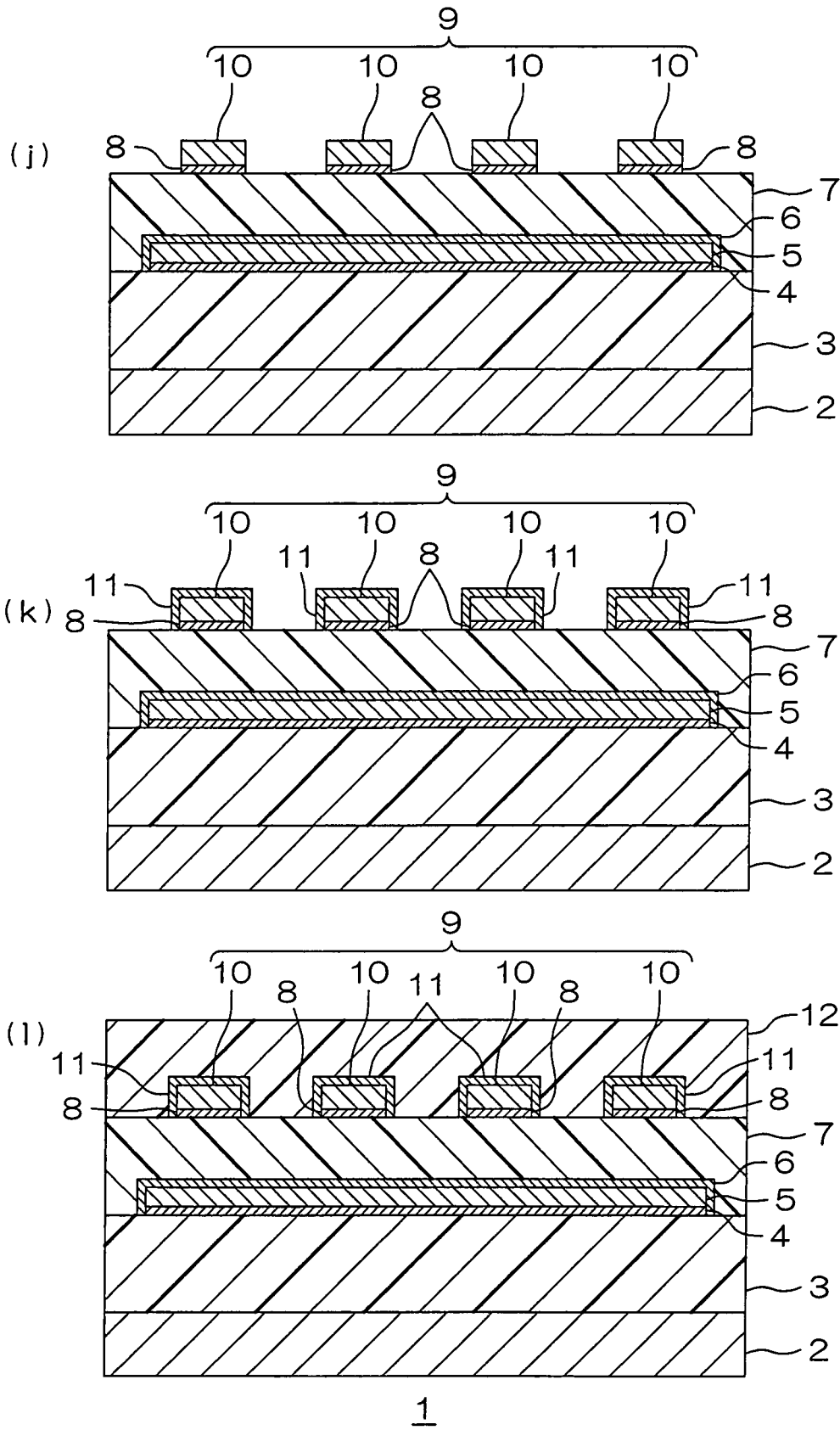
FIG. 4 is a production process view showing the method for producing the wired circuit board shown in FIG. 1, subsequently to FIG. 3, (j) showing the step of forming a third metal thin film and a conductive pattern on the first insulating base layer, (k) showing the step of forming a fourth metal thin film to cover the conductive pattern, and (l) showing the step of forming an insulating cover layer on the first insulating base layer to cover the fourth metal thin film.

Next, a description is given to a method for producing the wired circuit board 1 with reference to FIGS. 2 to 4.

First, as shown in FIG. 2(a), the metal supporting board 2 is prepared in the method.

Next, as shown in FIG. 2(b), a solution (varnish) of, e.g., the synthetic resin mentioned above is uniformly coated on the surface of the metal supporting board 2, dried, and then heated to be cured as necessary to form the second insulating base layer 3 made of the synthetic resin.

Alternatively, the second insulating base layer 3 may also be formed in a pattern by coating a photosensitive synthetic resin, drying, exposing to light, and developing the resin. The formation of the second insulating base layer 3 is not particularly limited to the methods shown above. For example, it is also possible to preliminarily form a synthetic resin into a film and then stick the film to the surface of the metal supporting board 2 via a known adhesive layer.

Next, as shown in FIG. 2(c), the first metal thin film 4 is formed on the entire surface of the second insulating base layer 3.

The first metal thin film 4 is formed by, e.g., sputtering, electrolytic plating, electroless plating, or the like.

For sputtering, a method is used in which any of the metals shown above is sputtered as a target. Preferably, chromium sputtering and copper sputtering are used to successively laminate a chromium thin film and a copper thin film.

For electrolytic plating, a method is used in which, e.g., a surface-treated wired circuit board 1 (treated with a process of forming a seed film, not shown, on the surface thereof) in a process of the production shown in FIG. 2(b) is dipped in a plating solution of any of the metals shown above to conduct in the plating solution. For electrolytic plating, an electrolytic nickel plating is preferably used in which the wired circuit board 1 in the process of the production shown in FIG. 2(b) is dipped in a nickel plating solution to conduct in the nickel plating solution.

For electroless plating, a method is used in which, e.g., a surface-treated wired circuit board 1 (treated with a process of forming a catalyst layer, not shown, on the surface thereof) in the process of the production shown in FIG. 2(b) is dipped in a plating solution of any of the metals shown above. Preferably, an electroless nickel plating is used in which the wired circuit board 1 in the process of the production shown in FIG. 2(b) is dipped in a nickel plating solution.

Among them, sputtering is preferably used to form the first metal thin film 4.

Next, as shown in FIG. 2(d), the metal foil 5 is formed on the entire surface of the first metal thin film 4.

The metal foil 5 is formed by, e.g., sputtering, electrolytic plating, electroless plating, or the like.

For sputtering, the same sputtering method as mentioned above is used. Preferably, copper sputtering is used to laminate a copper foil.

For electrolytic plating, a method is used in which, e.g., the wired circuit board 1 in a process of the production shown in FIG. 2(c) is dipped in a plating solution of any of the metals shown above and electrical conduction is caused in the first metal thin film 4 used as a seed film.

For electroless plating, a method is used in which, e.g., the wired circuit board 1 in the process of the production shown in FIG. 2(c) is dipped in a plating solution of any of the metals shown above.

Among them, sputtering is preferably used to form the metal foil 5.

By forming the metal foil 5 by sputtering, the metal foil 5 can be formed integrally with the first metal thin film 4.

In the formation of the metal foil 5 of the wired circuit board 1, when the thickness of the metal foil 5 is set to a value of not less than 2.0 μm as shown in FIG. 2(c), it is necessary to form the metal foil in two steps in such a way that the first metal thin film 4 (seed film) is formed by electrolytic plating first, and then the metal foil 5 on the first metal thin film 4 is formed by causing electrical conduction in the first metal thin film 4.

However, since the thickness of the metal foil in the wired circuit board is less than 2.0 μm, the metal foil 5 can also be formed only by sputtering. This allows easy formation of the metal foil 5 in one step and easy production of the wired circuit board 1 to achieve a reduction in production cost.

Next, as shown in FIG. 2(e), the etching resist 14 is formed in the same pattern as that of the metal foil 5 described above on the surface of the metal foil 5. For the formation of the etching resist 14, a known method is used in which, e.g., a dry film resist is provided, exposed to light, and developed.

Next, as shown in FIG. 3(f), the metal foil 5 and the first metal thin film 4 each exposed from the etching resist 14 are successively removed by etching.

Next, as shown in FIG. 3(g), the etching resist 14 is removed by, e.g., a known etching method such as wet etching or by stripping.

As a result, it is possible to form the first metal thin film 4 in the foregoing pattern on the second insulating base layer 3 and form the metal foil 5 in the foregoing pattern on the surface of the first metal thin film 4.

Next, as shown in FIG. 3(h), the second metal thin film 6 is formed on the upper surface and side surfaces of the metal foil 5 and on the side surfaces of the first metal thin film 4 to cover the metal foil 5 and the first metal thin film 4.

The second metal thin film 6 is formed by electrolytic plating, electroless plating, or the like. Preferably, the second metal thin film 6 is formed by electroless plating.

In electroless plating, the second metal thin film 6 is formed by dipping a surface-treated wired circuit board 1 (treated with a process of forming a catalyst layer, not shown, on the surface thereof) in a process of the production shown in FIG. 3(g) in a plating solution of any of the metals shown above, or preferably in a nickel plating solution to form the second metal film made of nickel.

Next, as shown in FIG. 3(i), a solution (varnish) of, e.g., the same synthetic resin as that used to form the second insulating base layer 3 is uniformly coated on the entire surface of the second insulating base layer 3 including the second metal thin film 6, dried, and then heated to be cured as necessary to form the first insulating base layer 7 made of the synthetic resin.

Alternatively, the first insulating base layer 7 may also be formed in a pattern by coating a photosensitive synthetic resin, drying, exposing to light, developing the resin, and then curing it as necessary. The formation of the first insulating base layer 7 is not limited to the methods shown above. For example, it is also possible to preliminarily form a synthetic resin into a film and then stick the film to the entire surface of the second insulating base layer 3 including the second metal thin film 6 via a known adhesive layer.

Next, as shown in FIG. 4(j), the third metal thin film 8 and the conductive pattern 9 are formed successively on the first insulating base layer 7.

The third metal thin film 8 and the conductive pattern 9 are formed by, e.g., a patterning method such as an additive method.

Specifically, in the additive method, the third metal thin film 8 (seed film) is formed first on the entire surface of the first insulating base layer 7. The third metal thin film 8 is formed in the same manner as in the method for forming the first metal thin film 4. Preferably, the third metal thin film 8 is formed by successively laminating a chromium thin film and a copper thin film by chromium sputtering and copper sputtering.

Next, a dry film resist is provided on the surface of the third metal thin film 8, exposed to light, and then developed to form a plating resist not shown in a pattern reverse to the wired circuit pattern. Then, the conductive pattern 9 is formed as the wired circuit pattern by plating on the surface of the third metal thin film 8 exposed from the plating resist. Then, the plating resist and the portion of the third metal thin film 8 where the plating resist is formed are removed by etching or the like. The plating may be either electrolytic plating or electroless plating. Preferably, electrolytic plating is used, or more preferably, electrolytic copper plating is used.

Next, as shown in FIG. 4(k), the fourth metal thin film 11 is formed on the upper surface and side surfaces of the conductive pattern 9 and on the side surfaces of the third metal thin film 8 to cover the conductive pattern 9 and the third metal thin film 8.

The fourth metal thin film 11 is formed in the same manner as in the method for forming the second metal thin film 6. Preferably, the fourth metal thin film 11 made of nickel is formed by an electroless nickel plating method in which a surface-treated wired circuit board 1 (treated with a process of forming a catalyst layer, not shown, on the surface thereof) in a process of the production shown in FIG. 4(j) is dipped in a nickel plating solution.

Next, as shown in FIG. 4(l), the solution of any of the synthetic resins mentioned above, e.g., is uniformly coated on the first insulating base layer 7 to cover the fourth metal thin film 11. The coating is then dried and heated to be cured as necessary to form the insulating cover layer 12 made of the synthetic resin.

Alternatively, the insulating cover layer 12 may also be formed in a pattern by coating a photosensitive synthetic resin, drying, exposing to light, developing the resin, and curing it as necessary. The formation of the insulating cover layer 12 is not limited to the methods shown above. For example, it is also possible to preliminarily form a synthetic resin into a film and stick the film to the surface of the first insulating base layer 7 to cover the fourth metal thin film 11 via a known adhesive layer.

The insulating cover layer 12 is formed to expose the terminal portions, not shown, of the conductive pattern 9. To expose the terminal portions of the conductive pattern 9, the insulating cover layer 12 is formed in a pattern using the photosensitive synthetic resin mentioned above or by a boring process using a laser or a punch.

Thereafter, the fourth metal thin film 11 formed on the upper surfaces of the terminal portions of the conductive pattern 9 is removed by etching or the like. Then, the metal supporting board 2 is trimmed into a desired shape to provide the wired circuit board 1.

In the wired circuit board 1, the metal foil 5 is formed to oppose to the conductive pattern 9 in the thickness direction. This allows a reduction in transmission loss with a simple layer structure.

Figure 9:
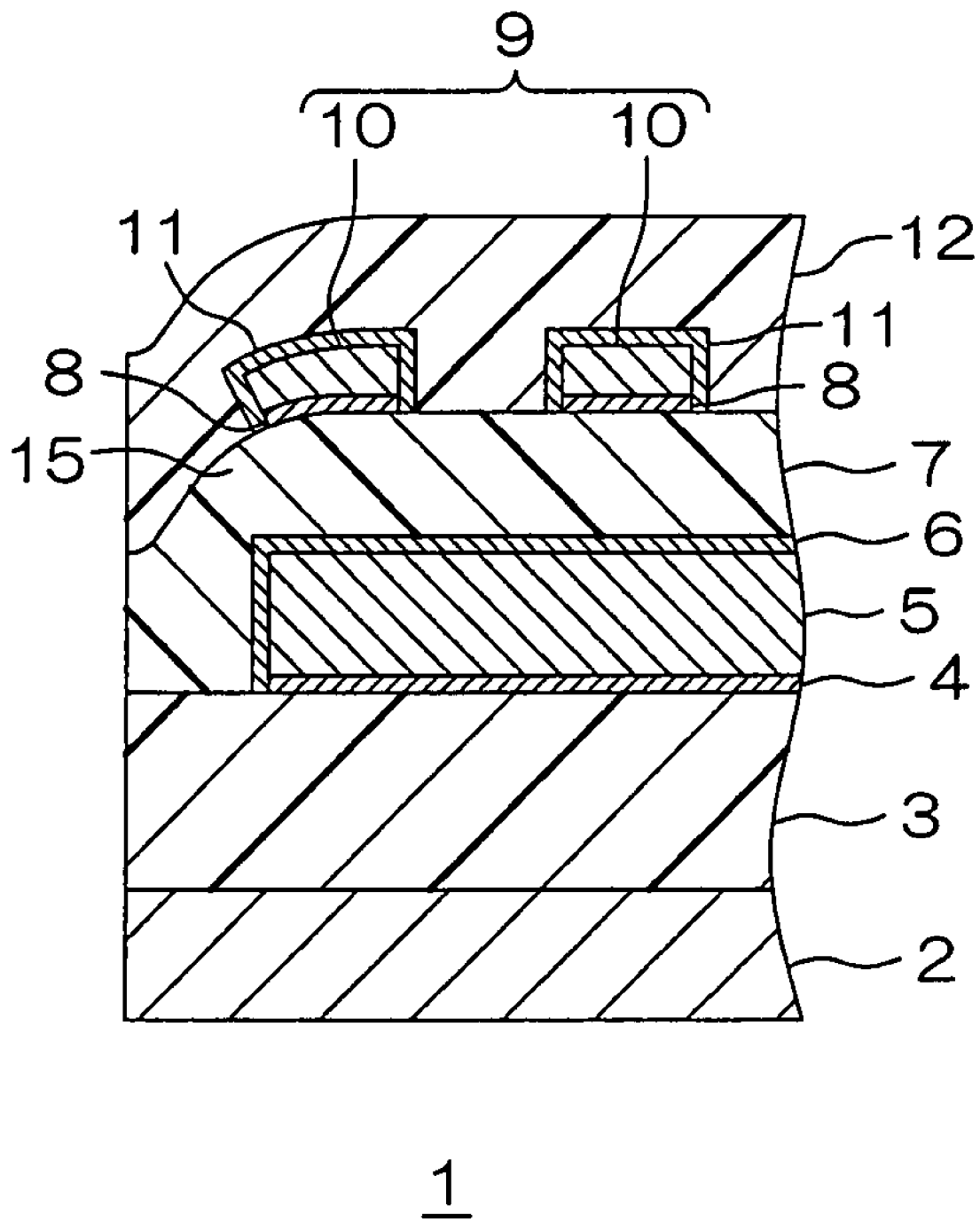
FIG. 9 is an enlarged cross-sectional view showing a principal portion of the end portion of the metal foil of a wired circuit board.

For example, when the metal foil 5 is formed to have a thickness of not less than 2.0 μm and then covered with the first insulating base layer 7, a large level difference (shoulder) 15 corresponding to the thickness of the metal foil 5 is formed in the first insulating base layer 7 covering the widthwise end portion of the metal foil 5, as shown in FIG. 9.

As a result, when the conductive pattern 9 is formed on the first insulating base layer 7, the conductive pattern 9 formed on the level difference 15 in the first insulating base layer 7 may undergo displacement due to the level difference 15, more specifically the displacement of the widthwise outermost wires 10, so that the accuracy of the placement (pattern) thereof deteriorates.

However, in the wired circuit board 1 described above, the thickness of the metal foil 5 is less than 2.0 μm. Accordingly, the level difference (see FIG. 9) formed between the respective portions of the first insulating base layer 7 where the metal foil 5 is formed and where the metal foil 5 is not formed can be reduced. This allows accurate formation of the conductive pattern 9 on the first insulating base layer 7.

When the insulating cover layer 12 is formed on the first insulating base layer 7 to cover the conductive pattern 9, the insulating cover layer 12 can be formed on the surface of the first insulating base layer 7 with reduced unevenness since the level difference 15 (see FIG. 9) in the first insulating base layer 7 is small and the conductive pattern 9 is formed accurately. As a result, it is possible to suppress the formation of an air pocket in the insulating cover layer 12 to ensure the excellent long-term reliability of the wired circuit board 1.

Additionally, in the wired circuit board 1, the second insulating base layer 3 is formed to be interposed between the first metal thin film 4 and the metal supporting board 2. As a result, it is possible to reduce the transmission loss with a simple layer structure and provide sufficient adhesion between the first metal thin film 4 and the metal supporting board 2 to ensure excellent long-term reliability.

Moreover, in the wired circuit board 1, the first metal thin film 4 is formed to be interposed between the metal foil 5 and the second insulating base layer 3. As a result, it is possible to reduce the transmission loss with a simple layer structure and provide sufficient adhesion between the metal foil 5 and the second insulating base layer 3 to ensure excellent long-term reliability.

Thus, in the wired circuit board 1, the second insulating base layer 3 and the first metal thin film 4 are formed successively between the metal supporting board 2 and the metal foil 5. As a result, it is possible to reduce the transmission loss with a simple layer structure and provide sufficient adhesion between the metal supporting board 2 and the metal foil 5 to ensure excellent long-term reliability.

In the wired circuit board 1, the second metal thin film 6 interposed between the metal foil 5 and the first insulating base layer 7 serves as a barrier layer to allow reliable prevention of the occurrence of ion migration phenomenon in which the metal of the metal foil 5 migrates to the first insulating base layer 7.

FIG. 5 to 8 are cross-sectional views showing respective principal portions of wired circuit boards according to other embodiments of the present invention.

Referring to FIGS. 5 to 8, a description is given to each of the wired circuit boards according to the other embodiments of the present invention. As for members corresponding to the individual components described above, the detailed description thereof is omitted by using the same reference numerals in each of FIGS. 5 to 8.

Although the second insulating base layer 3 is formed in the foregoing description of the wired circuit board 1 shown in FIG. 1, the present invention is not limited thereto. For example, it is also possible to form the first metal thin film 4 directly on the metal supporting board 2 without forming the second insulating base layer 3, as shown in FIG. 5.

Figure 5:
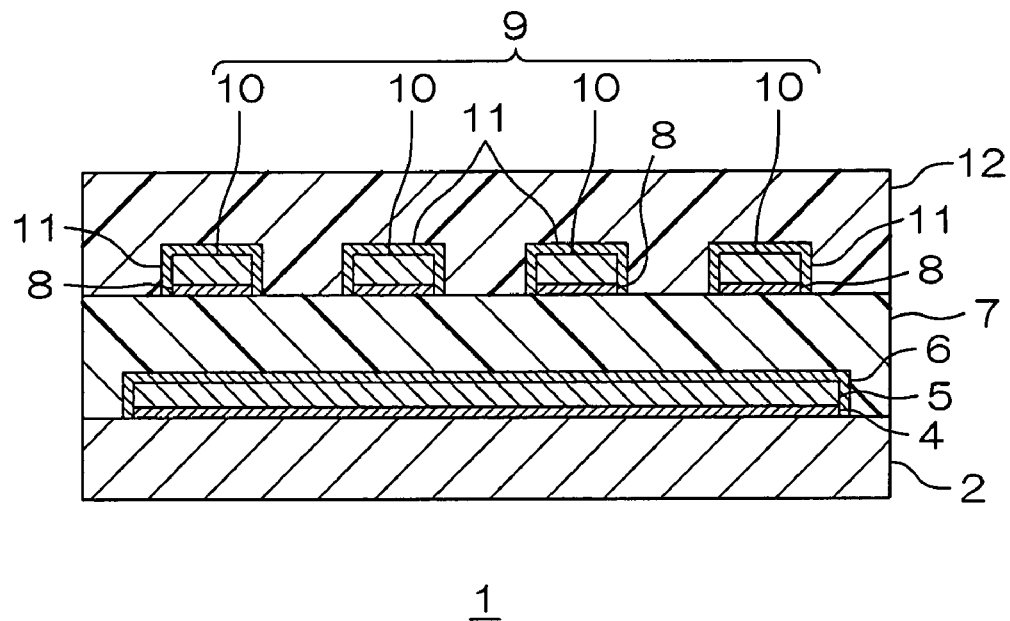
FIG. 5 is a cross-sectional view showing a principal portion of a wired circuit board according to another embodiment of the present invention in which the first metal thin film is formed directly on the surface of the metal supporting board.

In the wired circuit board 1 shown in FIG. 5, the first metal thin film 4 is formed on the surface of the metal supporting board 2. The first metal thin film 4 is formed to be interposed between the metal foil 5 and the metal supporting board 2.

The first insulating base layer 7 is formed on the metal supporting board 2 to cover the second metal thin film 6.

Since the second insulating base layer 3 is not formed in the wired circuit board 1, it is possible to more easily obtain the wired circuit board 1, while achieving reductions in weight and thickness of the wired circuit board 1.

Moreover, since the first metal thin film 4 is formed to be interposed between the metal foil 5 and the metal supporting board 2 in the wired circuit board 1, it is possible to reduce the transmission loss with a simple layer structure and provide sufficient adhesion between the metal foil 5 and the metal supporting board 2 to ensure excellent long-term reliability.

Although the first metal thin film 4 is formed in the foregoing description of the wired circuit board 1 shown in FIG. 5, the present invention is not limited thereto. For example, it is also possible to form the metal foil 5 directly on the metal supporting board 2 without forming the first metal thin film 4 and directly form the first insulating base layer 7 to cover the metal foil 5, as shown in FIG. 6.

Figure 6:
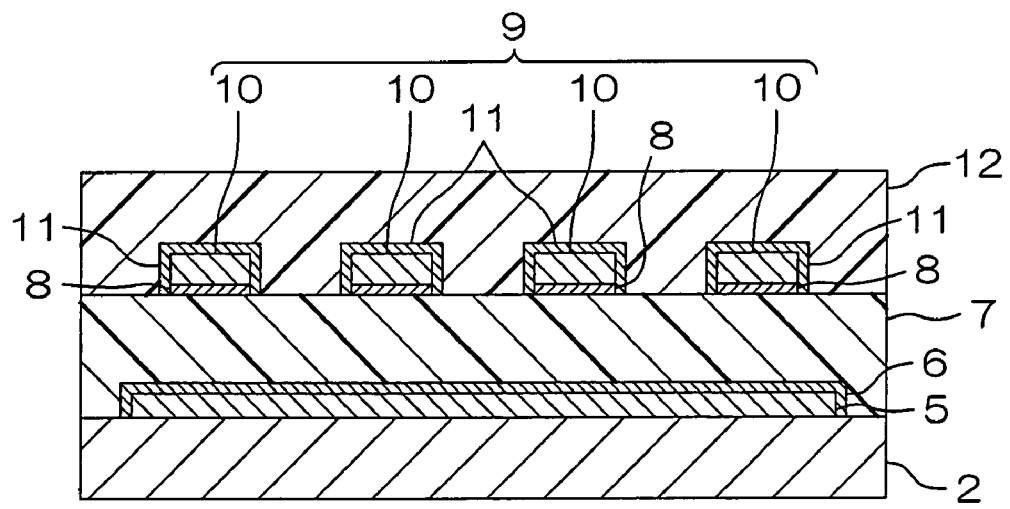
FIG. 6 is a cross-sectional view showing a principal portion of a wired circuit board according to still another embodiment of the present invention in which the metal foil is formed directly on the surface of the metal supporting board.

In the wired circuit board 1 shown in FIG. 6, the metal foil 5 is formed on the surface of the metal supporting board 2.

Because the second insulating base layer 3 and the first metal thin film 4 are not formed in the wired circuit board 1, it is possible to more easily obtain the wired circuit board 1, while achieving reductions in weight and thickness of the wired circuit board 1.

Although the metal foil 5 is formed directly on the metal supporting board 2 in the foregoing description of the wired circuit board 1 shown in FIG. 6, the present invention is not limited thereto. For example, it is also possible to form the metal foil 5 on the metal supporting board 2 via the second insulating base layer 3 as shown in FIG. 7.

Figure 7:
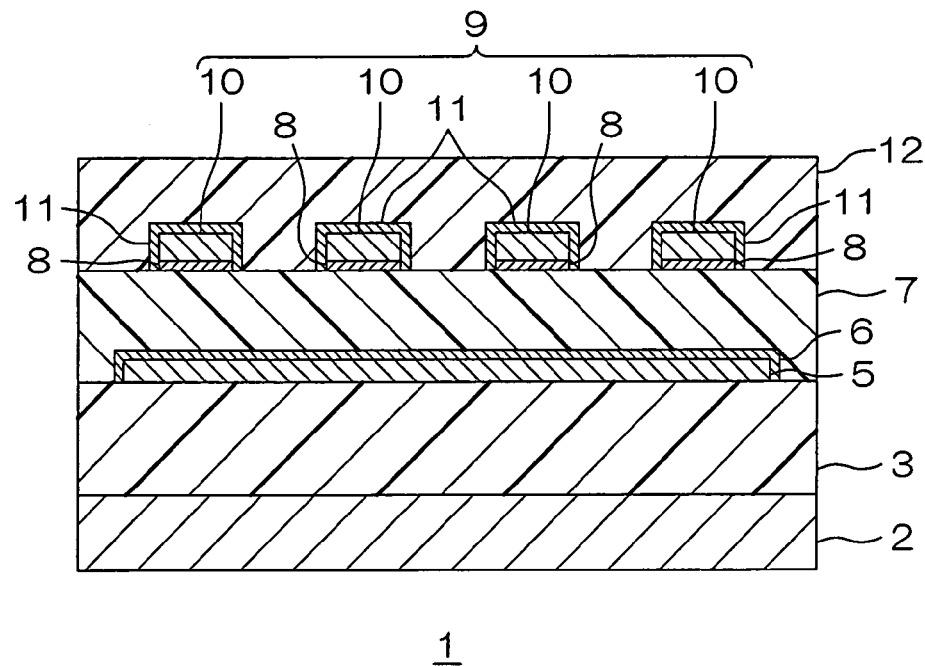
FIG. 7 is a cross-sectional view showing a principal portion of a wired circuit board according to yet another embodiment of the present invention in which the metal foil is formed on the metal supporting board via the second insulating base layer.

In the wired circuit board 1 shown in FIG. 7, the metal foil 5 is formed on the surface of the second insulating base layer 3.

The second insulating base layer 3 is formed to be interposed between the metal foil 5 and the metal supporting board 2.

The second metal thin film 6 is formed on the upper surface and side surfaces of the metal foil 5 to cover the upper surface and the side surfaces. The second metal thin film 6 is also formed to be interposed between the metal foil 5 and the first insulating base layer 7.

Moreover, since the second insulating base layer 3 is formed to be interposed between the metal foil 5 and the metal supporting board 2 in the wired circuit board 1, it is possible to reduce the transmission loss with a simple layer structure and provide sufficient adhesion between the metal foil 5 and the metal supporting board 2 to ensure the excellent long-term reliability of the wired circuit board 1.

Although the metal foil 5 is formed between the two outermost wires 10 in the widthwise direction of the conductive pattern 9, the present invention is not limited thereto. For example, the metal foil 5 can also be formed to include discrete portions 13 corresponding to the plurality of wires 10, as shown in FIG. 8.

Figure 8:
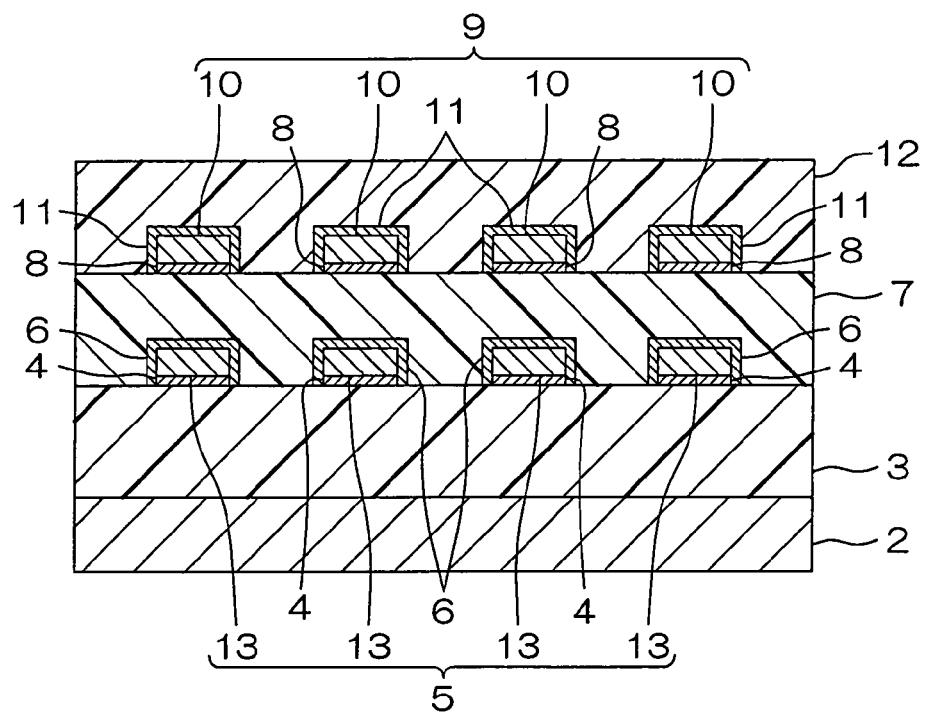
FIG. 8 is a cross-sectional view showing a principal portion of a wired circuit board according to still another embodiment of the present invention in which the metal foil has a plurality of discrete portions corresponding to a plurality of wires.

In the wired circuit board 1 shown in FIG. 8, the metal foil 5 includes the plurality of discrete portions 13. The respective discrete portions 13 are arranged in widthwise spaced-apart and longitudinally parallel relation to oppose to the respective wires 10 in the thickness direction.

The width of each of the discrete portions 13 is in the range of, e.g., 10 to 100 µm, or preferably 15 to 50 µm. The spacing between the individual discrete portions 13 is in the range of, e.g., 10 to 100 µm, or preferably 15 to 50 µm.

Thus, since the metal foil 5 in the wired circuit board 1 includes the plurality of discrete portions 13 arranged in mutually spaced-apart relation, the metal foil 5 can be formed to correspond to the plurality of wires 10, i.e., the number and shapes of the wires 10, while retaining flexibility.

When the metal foil 5 includes the discrete portions 13, a larger number of end portions including the both widthwise end portions of the discrete portions 13 are formed in the metal foil 5 to correspond to the discrete portions 13. Accordingly, a larger number of level differences 15 (see FIG. 9) are formed in the first insulating base layer 7.

However, since the thickness of the metal foil 5 is less than 2.0 µm in the wired circuit board 1, it is possible to reduce each of the level differences 15 resulting from the thickness of the metal foil 5. As a result, even when a larger number of level differences 15 are formed in the first insulating base layer 7, the conductive pattern 9 can be formed accurately.

Although the discrete portions 13 are formed to correspond to the respective wires 10 in the description of the wired circuit board 1 shown in FIG. 8, the formation of the discrete portions 13 is not limited thereto as long as they are arranged in mutually spaced-apart relation. For example, it is also possible to arrange the discrete portions 13 such that at least a portion of the respective discrete portions 13 opposes to the respective wires 10 in the thickness direction, though they are not illustrated.

EXAMPLES

The present invention is described more specifically by showing the examples and the comparative examples herein below. However, the present invention is by no means limited to the examples and the comparative examples.

Example 1

A metal supporting board made of stainless steel having a thickness of 25 µm was prepared first (see FIG. 2(a)).

Then, a copper foil having a thickness of 0.05 µm as a metal foil was formed by copper sputtering on the entire surface of the metal supporting board (see FIG. 2(d)). Then, a dry film resist was provided on the surface of the metal foil, exposed to light, and developed to form an etching resist in the same pattern as that of the metal foil (see FIG. 2(e)). Subsequently, the metal foil exposed from the etching resist was removed by chemical etching (see FIG. 3(f)). Thereafter, the etching resist was removed (see FIG. 3(g)).

Then, a nickel thin film having a thickness of 0.1 µm as a second metal thin film was formed by electroless nickel plating on the upper surface and side surfaces of the metal foil to cover the metal foil (see FIG. 3(h)).

Then, a varnish of a photosensitive polyamic acid resin was coated on the entire surface of the metal supporting board including the second metal thin film, dried, exposed to light, developed, and further heated to be cured to form a first insulating base layer made of polyimide having a thickness of 10 μm (see FIG. 3(i)).

Then, a third metal thin film serving as a seed film and a conductive pattern were formed successively by an additive method on the first insulating base layer (see FIG. 4(j)).

In the additive method, a chromium thin film having a thickness of 0.03 μm and a copper thin film having a thickness of 0.07 μm were formed successively on the entire surface of the first insulating base layer by chromium sputtering and copper sputtering as the third metal thin film. Subsequently, a dry film resist was provided on the surface of the third metal thin film, exposed to light, and developed to form a plating resist in a pattern reverse to the conductive pattern. Then, the conductive pattern having a thickness of 10 μm was formed on the surface of the third metal thin film exposed from the plating resist by electrolytic copper plating. Then, the plating resist and the portion of the third metal thin film where the plating resist was formed were removed by chemical etching (see FIG. 4(j)).

Then, a nickel thin film having a thickness of 0.1 μm was formed as a fourth metal thin film on the upper surface and side surfaces of the conductive pattern and on the side surfaces of the third metal thin film by electroless nickel plating to cover the conductive pattern and the third metal thin film (see FIG. 4(k)).

Then, a varnish of a photosensitive polyamic acid resin was coated to cover the fourth metal thin film, dried, exposed to light, developed, and further heated to be cured to form an insulating cover layer made of polyimide having a thickness of 5 μm in a pattern covering the fourth metal thin film (except for the portions where the terminal portions were formed) on the surface of the first insulating base layer (see FIG. 4(l)). Thereafter, the fourth metal thin film formed on the upper surfaces of the terminal portions was removed by etching. Then, the metal supporting board was cut out into a desired shape by etching to provide a suspension board with circuit (see FIG. 6).

Example 2

A suspension board with circuit was obtained in the same manner as in EXAMPLE 1 except that the thickness of the metal foil was changed to 0.1 μm in the formation of the metal foil.

Example 3

A suspension board with circuit was obtained in the same manner as in EXAMPLE 1 except that the thickness of the metal foil was changed to 0.2 μm in the formation of the metal foil.

Example 4

A suspension board with circuit was obtained in the same manner as in EXAMPLE 1 except that the thickness of the metal foil was changed to 0.5 μm in the formation of the metal foil.

Example 5

A suspension board with circuit was obtained in the same manner as in EXAMPLE 1 except that the thickness of the metal foil was changed to 1.5 μm in the formation of the metal foil.

Example 6

A suspension board with circuit was obtained in the same manner as in EXAMPLE 1 except that the thickness of the metal foil was changed to 1.8 μm in the formation of the metal foil.

Comparative Example 1

A suspension board with circuit was obtained in the same manner as in EXAMPLE 1 except that the thickness of the metal foil was changed to 2.0 μm in the formation of the metal foil.

Comparative Example 2

A suspension board with circuit was obtained in the same manner as in EXAMPLE 1 except that the thickness of the metal foil was changed to 4.0 μm in the formation of the metal foil.

Comparative Example 3

A suspension board with circuit was obtained in the same manner as in EXAMPLE 1 except that the metal foil and the second metal thin film were not formed. In other words, the first insulating base layer was formed on the entire surface of the metal supporting board.

(Evaluation)

(1) Evaluation of Transmission Efficiency

In each of the suspension boards with circuit obtained in the examples and the comparative examples, an output signal intensity ($P_{OUT}$) and an input signal intensity ($P_{IN}$) were measured and the transmission efficiency was evaluated as the ratio of the output signal intensity to the input signal intensity given by Formula (1) shown below. The result of the evaluation is shown in Table 1.

$$\text{Transmission Efficiency}(\%) = P_{OUT}/P_{IN} \quad (1)$$

(2) Evaluation of Evenness

The evenness of each of the suspension boards with circuit obtained in the examples and the comparative examples was evaluated by observing the displacement of the wires in the vicinity of the end portions of the metal foil (in the vicinity of the widthwise outermost wires in COMPARATIVE EXAMPLE 3). The result of the evaluation is shown in Table 1, which is expressed as follows.

Excellent: Wire Displacement was Not Observed
Acceptable: Wire Displacement was Slightly Observed Table 1

TABLE 1

| Suspension Board with Circuit | | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|
| Thickness of Metal Foil (μm) | | 0.05 | 0.1 | 0.2 | 0.5 | 1.5 | 1.8 | 2.0 | 4.0 | 0.0 |
| Evaluation | Tansmission Efficiency ($P_{OUT}/P_{IN}$) (%) | 57.4 | 70.3 | 72.9 | 74.9 | 78.4 | 79.0 | 79.1 | 79.1 | 55.0 |
| | Evenness | Excellent | Excellent | Excellent | Excellent | Excellent | Excellent | Acceptable | Acceptable | Excellent |

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
a metal supporting board;
a metal foil formed on the metal supporting board to have a thickness of less than 2.0 μm;
a first insulating layer formed on the metal supporting board to cover the metal foil; and
a conductive pattern formed on the first insulating layer, wherein
the first insulating layer is provided so as to cover an upper surface and widthwise side surfaces of the metal foil to form a level difference corresponding to the thickness of the metal foil in the first insulating layer covering a widthwise end portion of the metal foil.

2. The wired circuit board according to claim 1, further comprising:
a first metal thin film formed to be interposed between the metal foil and the metal supporting board.

3. The wired circuit board according to claim 2, further comprising:
a second insulating layer formed to be interposed between the first metal thin film and the metal supporting board.

4. The wired circuit board according to claim 1, further comprising:
a second insulating layer formed to be interposed between the metal foil and the metal supporting board.

5. The wired circuit board according to claim 1, further comprising:
a second metal thin formed to be interposed between the metal foil and the first insulating layer.

6. The wired circuit board according to claim 1, wherein the conductive pattern comprises a plurality of wires arranged in mutually spaced-apart relation and the metal foil comprises a plurality of discrete portions arranged in mutually spaced-apart relation such that at least a portion of the respective discrete portions opposes to the respective wires in a thickness direction.

7. The wired circuit board according to claim 1, wherein the metal foil is formed by sputtering.

8. The wired circuit board according to claim 1, wherein the thickness of the metal foil is in the range of 0.2 to 0.5 μm.

* * * * *